(12) United States Patent
Yu et al.

(10) Patent No.: US 7,903,764 B2
(45) Date of Patent: Mar. 8, 2011

(54) INTEGRATED BURST FSK RECEIVER

(75) Inventors: Tommy Yu, Orange, CA (US); Steve Krafft, Los Angeles, CA (US); Steven Jaffe, Irvine, CA (US); Alan Kwentus, Coto de Caza, CA (US)

(73) Assignee: Broadcom Corporation, Irvine, CA (US)

( * ) Notice: Subject to any disclaimer, the term of this patent is extended or adjusted under 35 U.S.C. 154(b) by 1195 days.

(21) Appl. No.: 10/952,171

(22) Filed: Sep. 29, 2004

(65) Prior Publication Data

US 2005/0249307 A1 Nov. 10, 2005

Related U.S. Application Data

(60) Provisional application No. 60/569,236, filed on May 10, 2004.

(51) Int. Cl.
*H03K 9/06* (2006.01)
*H04L 27/14* (2006.01)

(52) U.S. Cl. .......................... 375/334; 375/316; 329/300

(58) Field of Classification Search .................. 375/316, 375/334, 335, 336; 329/315, 300
See application file for complete search history.

(56) References Cited

U.S. PATENT DOCUMENTS

| | | | |
|---|---|---|---|
| 5,157,672 A * | 10/1992 | Kondou et al. ............... 714/795 |
| 5,230,011 A * | 7/1993 | Gielis et al. .................... 375/344 |
| 5,291,081 A * | 3/1994 | Takeuchi et al. ................ 327/47 |
| 6,091,931 A * | 7/2000 | Ben-Efraim et al. ......... 455/3.02 |
| 6,215,830 B1 * | 4/2001 | Temerinac et al. ........... 375/326 |
| 6,263,195 B1 * | 7/2001 | Niu et al. .................... 455/150.1 |
| 6,597,729 B1 * | 7/2003 | Schmidl et al. ............... 375/149 |
| 6,603,349 B2 * | 8/2003 | Carrozza et al. ............... 329/304 |
| 6,735,260 B1 * | 5/2004 | Eliezer et al. ................. 375/316 |
| 6,914,946 B1 * | 7/2005 | Horvat et al. ................. 375/334 |
| 6,985,541 B1 * | 1/2006 | Luff .............................. 375/324 |
| 7,006,565 B1 * | 2/2006 | Endres et al. ................. 375/233 |
| 7,099,679 B2 * | 8/2006 | Rainish et al. ................ 455/506 |
| 7,254,189 B1 * | 8/2007 | Kazakevich et al. ......... 375/326 |
| 7,529,313 B2 * | 5/2009 | Naito et al. .................... 375/271 |
| 7,567,631 B2 * | 7/2009 | Birkett et al. ................. 375/331 |
| 2001/0021234 A1 * | 9/2001 | Katayama et al. ............ 375/344 |
| 2003/0002600 A1 * | 1/2003 | Twu et al. ..................... 375/334 |
| 2003/0174604 A1 * | 9/2003 | Takehara et al. ............ 369/47.22 |
| 2004/0081205 A1 * | 4/2004 | Coulson ........................ 370/503 |
| 2004/0208263 A1 * | 10/2004 | Rives et al. ................... 375/327 |
| 2004/0264392 A1 * | 12/2004 | Mochizuki .................... 370/282 |
| 2005/0220218 A1 * | 10/2005 | Jensen et al. .................. 375/302 |
| 2007/0201588 A1 * | 8/2007 | Loiseau et al. ................ 375/346 |

* cited by examiner

*Primary Examiner* — David C Payne
*Assistant Examiner* — Linda Wong
(74) *Attorney, Agent, or Firm* — Sterne, Kessler, Goldstein & Fox P.L.L.C.

(57) ABSTRACT

An integrated burst FSK receiver is provided to receive and interpret an RF signal using FSK modulation. The integrated burst FSK receiver uses a programmable RF local oscillator to mix a received signal down to an IF range or baseband, where it is filtered and sampled for subsequent digital processing. Digital filtering and detection are employed to improve overall bit error rate performance and receiver sensitivity. A programmable digital low-pass or band-pass filter can also be used to suppress interference. A matched filter correlator can be used for detection and symbol timing adjustment in one mode, while an adaptive frequency comparator can be used in another mode. Circuits are provided that estimate carrier offset, frequency deviation and signal strength. These measurements can then be used to optimize the receiver performance. A method for receiving and interpreting an RF signal using FSK modulation is also provided.

13 Claims, 8 Drawing Sheets

US 7,903,764 B2

INTEGRATED BURST FSK RECEIVER

CROSS REFERENCE TO RELATED APPLICATION

This application claims the benefit of priority to U.S. Provisional Patent Application Ser. No. 60/569,236, filed May 10, 2004, which is incorporated herein by reference in its entirety.

BACKGROUND OF THE INVENTION

1. Field of the Invention

The present invention is related to receivers for frequency shift keying (FSK) modulated signals.

2. Background

Frequency shift keying (FSK) modulation changes the frequency of a signal over a time period to represent different values of a bit. For example, in the case of binary FSK modulation, a bit "0" is represented by a sine wave with frequency $f_0$ over one bit period and a bit "1" is represented by a sine wave of frequency $f_1$.

While widely used, existing FSK receivers suffer serious limitations. For example, existing FSK receivers use fixed local oscillators, have no baseband filtering prior to frequency discrimination, and use fixed bandwidth data filters prior to bit detection that limits performance and flexibility. Furthermore, all signal processing is done in the analog domain, and RF gain stages within receivers are not programmable. These constraints further limit the robustness and flexibility of FSK receivers. Additionally, existing FSK receivers are not integrated onto a larger system chip, but typically make up a standalone chip with many peripheral discrete components. As a result, existing FSK receivers are relatively expensive. Finally traditional burst FSK receivers use an asynchronous architecture with no correlators for preamble or data detection, and no symbol timing recovery further limiting receiver robustness.

Therefore, what is needed is a robust integrated burst FSK receiver that operates cost effectively over a wide range of applications.

SUMMARY OF THE INVENTION

The present invention provides an integrated burst FSK receiver that can use a programmable RF local oscillator to mix the FSK signal down to an IF range or baseband, where it is filtered and sampled for subsequent digital processing. Digital filtering and detection are employed to improve overall bit error rate performance and receiver sensitivity in the presence of noise. A programmable digital low-pass or band-pass filter can also be used to suppress in-band interference. A matched filter correlator can be used for detection and symbol timing adjustment in one mode, while an adaptive frequency comparator is used in another mode. Circuits are provided that estimate carrier offset, frequency deviation and signal strength. These measurements can then be used to optimize the receiver performance. A method for receiving an FSK modulated signal and making a decision with respect to the value of a bit represented by the signal is also provided.

The present invention provides a wide range of advantages, which include but are not limited to the following. The invention can be integrated onto a system chip in a set top box for lower cost, ease of adding features and accessibility by a host CPU. The high programmability of the invention allows the same receiver chip or design to be used in many applications, such as, for example satellite set top boxes. Many of the receiver functions are in the digital domain where parameters are much easier to control for filtering and frequency discrimination. The present invention uses a programmable local oscillator for flexibility in channel selection and compensation of carrier offset in software. The use of programmable RF gain amplifiers allows optimization of noise/distortion performance. The present invention also can include highly flexible baseband filtering, which can be adapted to optimize signal to noise ratio (SNR). The carrier offset and frequency deviation can be estimated on the first burst of an FSK modulated signal, allowing optimization of the receiver filtering for all subsequent bursts by frequency-centering and narrowing the bandwidths. Signal strength can also be estimated digitally, improving packet detection reliability enabling the use of RF automatic gain control algorithms and enabling an RF scan to identify the lowest-noise channel. Preamble and data correlation with timing recovery provide enhanced performance at low SNR. The present invention can operate in a lower SNR environment than traditional implementations. As a result the present invention has a longer physical operating range, more robust receiver performance, and better anti jamming capability.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
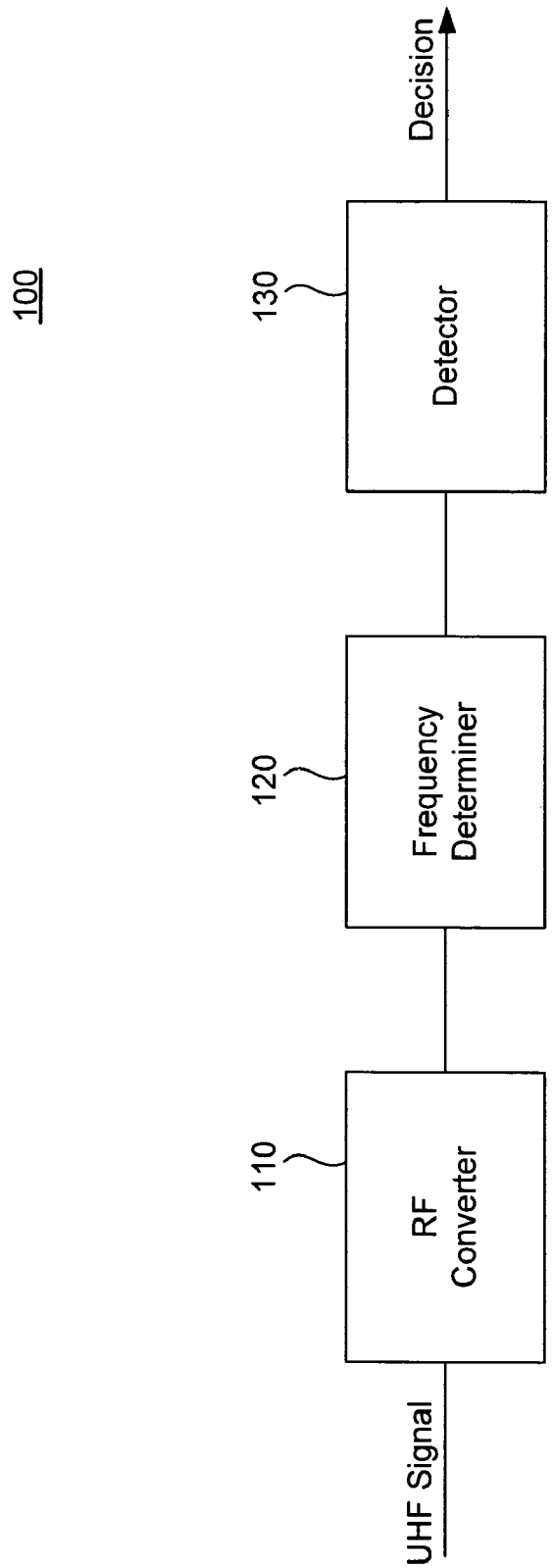
FIG. 1 is a diagram of an integrated burst FSK receiver.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 provides a high-level block diagram of an integrated burst FSK receiver 100. Integrated burst FSK receiver 100 includes an RF converter 110, a frequency determiner 120 and a detector 130. RF converter 100 receives a UHF signal that uses FSK modulation. The FSK modulation can be either binary or M-ary. RF converter 110 converts the received UHF signal to a digital sampled IF or baseband signal. An embodiment of RF converter 110 is discussed below with reference to FIG. 2.

The output of RF converter 110 is coupled to the input of frequency determiner 120. Frequency determiner 120 generates a frequency indicator signal based on the digital sampled IF or baseband signal output. The frequency indicator signal provides an indication of the frequency of the data contained within the received UHF signal that can be used to determine the value of the data. Embodiments of frequency determiner 120 are discussed below with reference to FIGS. 3-5.

The output of frequency determiner 120 is coupled to the input of detector 130. Detector 130 produces a decision based on the frequency indicator signal. For example, binary FSK detector 130 will produce either a 1 or a 0 as the decision. Detector 130 can be implemented in a number of ways as discussed with respect to FIGS. 6 and 7.

Figure 2:
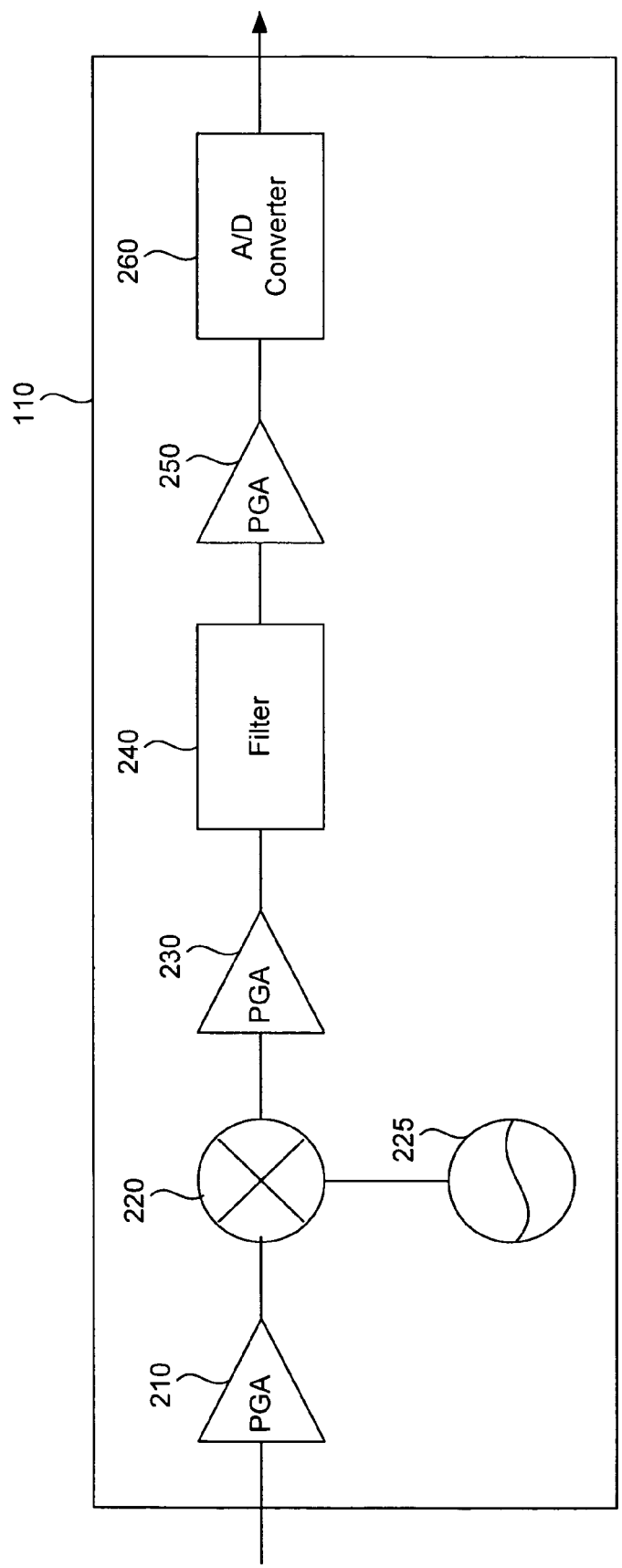
FIG. 2 is a diagram of an RF converter.

FIG. 2 provides a diagram of an exemplary RF converter 110. RF converter 110 includes a programmable gain amplifier 210, a mixer 220, a local oscillator 225, a programmable gain amplifier 230, a filter 240, a programmable gain amplifier 250 and an analog/digital converter 260.

A received RF signal using FSK modulation is first amplified by programmable gain amplifier 210. Programmable gain amplifier 210 supports a flexible partitioning of on-chip and off-chip gain for the case where an off-chip low noise amplifier is desired. The received RF signal is then converted to IF band or baseband by mixer 220. Mixer 220 uses a programmable local oscillator synthesizer to support a wide range of RF channel frequencies. The RF frequency can, for example, be in the UHF range around 400 Mhz. The IF frequency provided by local oscillator 225 can, for example, be 389.3 Mhz. The frequency band of the mixer output is then centered at 10.7 MHz.

The downconverted signal produced by mixer 220 is provided to programmable gain amplifier 230. Programmable gain amplifier 230 amplifies the downconverted signal and provides the signal to filter 240. Filter 240 suppresses signal content outside the frequency band of interest to remove interference, thermal noise or other distortion products. Filter 240 can be on-chip or off-chip, depending on the cost and performance tradeoffs of the system design. The bandwidth of the channel of interest is typically in the 50 to 500 kHz range.

Filter 240 passes the filtered downconverted signal to programmable gain amplifier 250. Programmable gain amplifier provides additional gain to the filtered downconverted signal and then passes the filtered downconverted signal to analog/digital converter 260. Analog/digital converter 260 converts the filtered downconverted signal to digital to produce a digital sampled signal. A 1-bit or multi-bit converter can be used.

In general analog circuits within RF converter 110 are designed for low noise figure for maximum sensitivity to very weak input signals, while also maintaining good distortion characteristics to handle large dynamic ranges seen in burst FSK systems. To minimize power supply noise, on-chip voltage regulators can be used to power the CMOS circuits.

In an alternative embodiment, signal strength can be estimated by using power detection on the digital sampled signal output from A/D converter 260.

Figure 3:
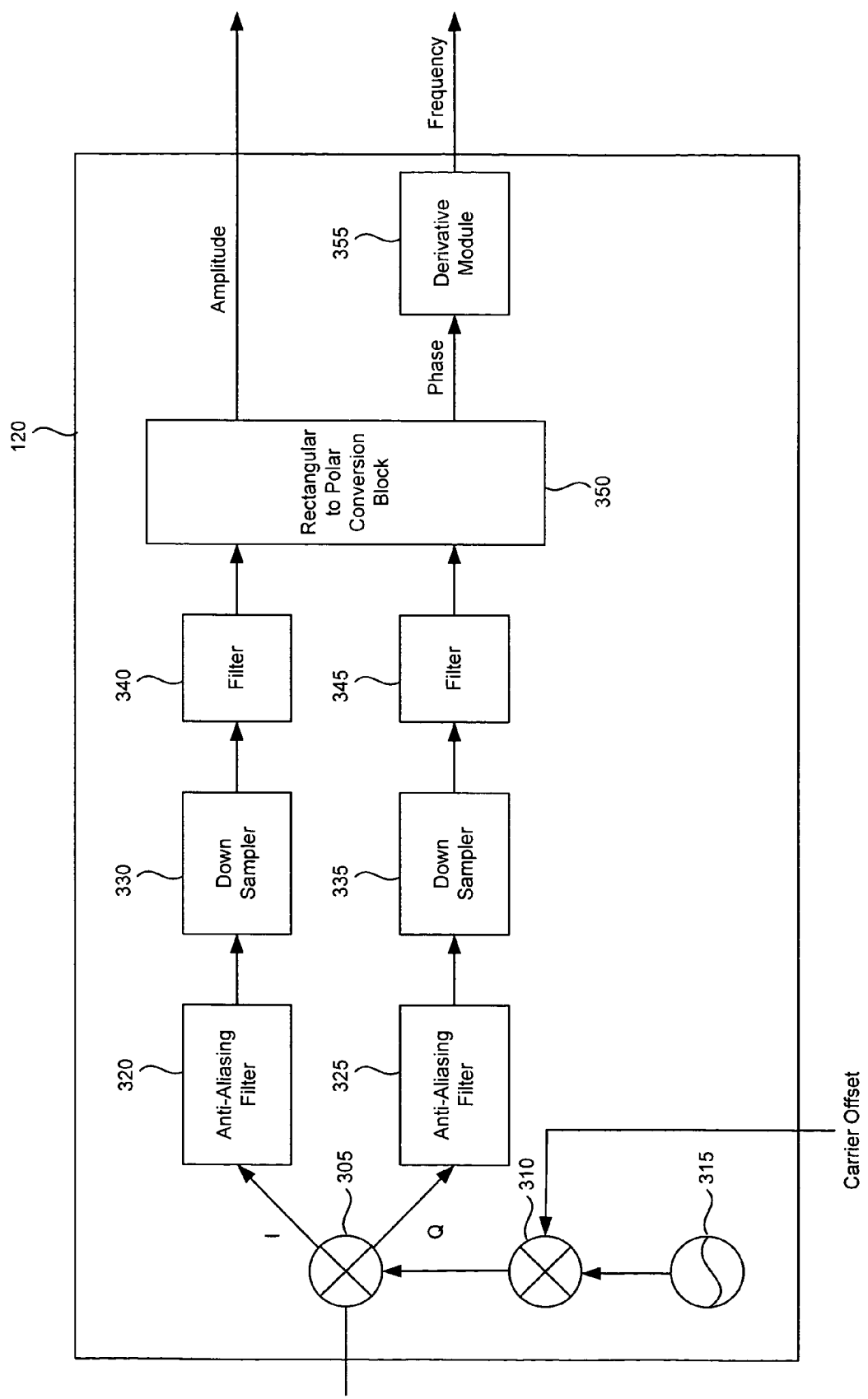
FIG. 3 is a diagram of frequency determiner.

FIG. 3 shows an example of frequency determiner 120. Frequency determiner 120 includes a mixer 305, a mixer 310, and a local oscillator 315. Frequency determiner 120 includes two processing paths for the I and Q components of a received digital sampled signal. The I path includes an anti-aliasing filter 320, a down sampler 330, and a filter 340. Likewise the Q path includes an anti-aliasing filter 325, a down sampler 335, and a filter 345. The I and Q paths come together in a rectangular to polar conversion block 350. A derivative module 355 is coupled to a phase output of the rectangular to polar conversion block 350.

Mixer 305 receives the digital sampled signal and converts it to a quadrature baseband signal with I and Q components. Mixer 305 can be coupled to circuitry to adjust for a carrier offset in the incoming signal. In the embodiment illustrated in FIG. 3, mixer 305 is coupled to mixer 310. Mixer 310 is coupled to local oscillator 315 and also receives a carrier offset signal. Mixer 310 combines the output of local oscillator 315 and a carrier offset signal. The output of mixer 310 is provided to mixer 305 to adjust for the carrier offset. This results in a signal which is frequency-centered in the IF and baseband frequencies. Additional detector circuitry can be used to estimate the FSK frequency deviation to allow programmable filter bandwidths to be tightened to maximize in-band signal to noise ratios. The carrier offset can be provided by detector 130.

Mixer 305 provides a quadrature baseband signal with I and Q components. The I component is passed through anti-aliasing filter 320, down sampler 330 and filter 340. Similarly, the Q component is passed through anti-aliasing filter 325, down sampler 335 and filter 345. Anti-aliasing filters 320 and 325 are used to remove harmonics created by quantization or limiting in an analog to digital converter, such as analog to digital converter 260. Anti-aliasing filters 320 and 325 also can remove adjacent channel information and reject other noise. Anti-aliasing filters 320 and 325 can be highly programmable.

Down samplers 330 and 335 are used to down sample the received digital signal. For example, down samplers 330 and 335 can retain one sample for every twenty samples received to reduce the signal rate from 1 Mb/s to 50 Kb/s. The outputs of down samplers 330 and 335 are provided to filters 340 and 345, respectively. These filters are highly programmable and provide for further noise reduction within the received digital signal. While two anti-aliasing filters, down samplers and filters are shown. A single anti-aliasing filter, a single down sampler and a single filter can be used.

The output of filters 340 and 345 are provided to the rectangular to polar conversion block 350. The rectangular to polar conversion block 350 extracts the phase and magnitude of a complex signal. The rectangular to polar conversion block 350 includes a CORDIC processor or look-up table that can be used to implement the required arctangent function to extract the phase and magnitude information. The rectangular to polar conversion block 350 provides an amplitude output and a phase output. Derivative module 355 is coupled to the phase output. Derivative module 355 generates frequency information with a phase difference function applied to the phase output, followed by a phase unwrapper to remove the artificial 2*Pi discontinuities. This results in a signal which is proportional to the frequency changes of the transmitted baseband FSK-modulated bit stream, plus any channel noise and impairments that remain. This "frequency indicator" signal is then passed to detector 130 for further processing.

In a further feature, power detection can be done on the amplitude output of the rectangular to polar conversion block 350. The signal strength indicator can be fed to detector 130 for more reliable detection of transmit packets. It may also be used in conjunction with programmable gain amplifiers 210, 230, and 250 to implement an automatic gain control algorithm with assistance from a CPU to allow optimal performance over a wide dynamic range of RF input levels. Signal strength can also be used to scan multiple RF channels to find the ones with the least amount of interference in a system where several channels are available.

Figure 4:
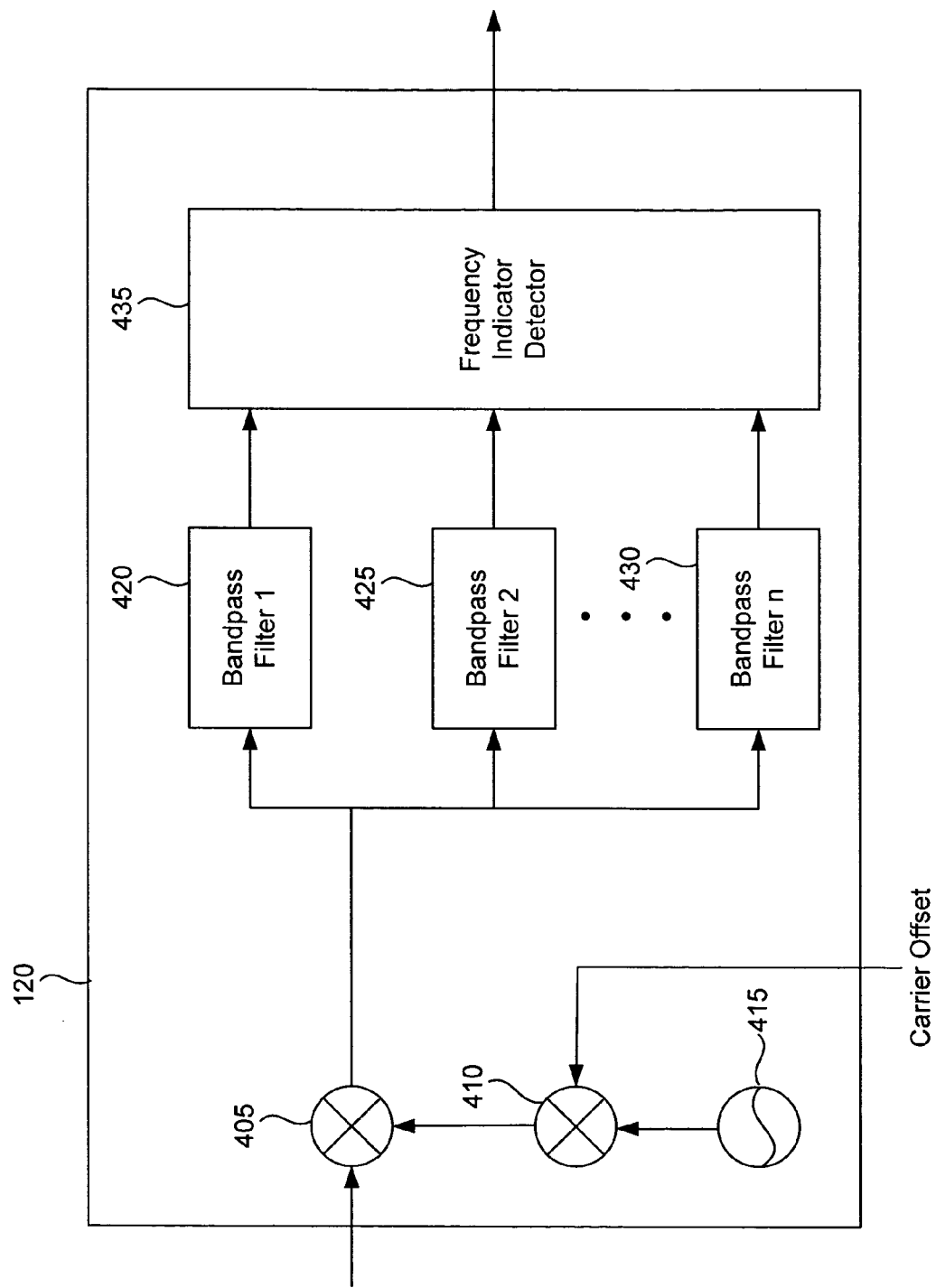
FIG. 4 is a diagram of frequency determiner.

In an alternative embodiment, frequency determiner 120 can use bandpass energy detection on the digitized downconverted signal to create the frequency indicator signal, as illustrated in FIG. 4. FIG. 4 shows an embodiment of frequency determiner 120. Frequency determiner 120 includes a mixer 405, a mixer 410 and a local oscillator 415. Frequency determiner 120 also includes a bank of bandpass filters—bandpass filters 420, 425 and 430—and frequency indicator detector 435. The received digital sampled IF signal is converted to baseband by mixer 410.

In the embodiment illustrated in FIG. 4, mixer 405 is coupled to mixer 410. Mixer 410 is coupled to local oscillator 415 and also receives a carrier offset signal. Mixer 410 combines the output of local oscillator 415 and a carrier offset signal. The output of mixer 410 is provided to mixer 405 to adjust for the carrier offset. This results in a signal which is frequency-centered in the IF and baseband frequencies.

The baseband signal output of mixer 405 is provided to the bank of bandpass filters 420 through 430. The center of each bandpass filter is chosen to be the frequency of a symbol in the FSK symbol set. For example, two bandpass filters are used for binary FSK with one filter centered at $f_0$ and the other one centered at $f_1$. The filtered output signals of the bank of bandpass filters are provided to frequency indicator detector 435. Frequency indicator detector 435 detects the maximum energy among the filter outputs. The output of frequency indicator detector 435 is sampled by a baud clock for a final decision as to what should be the "frequency indicator" signal.

Figure 5:
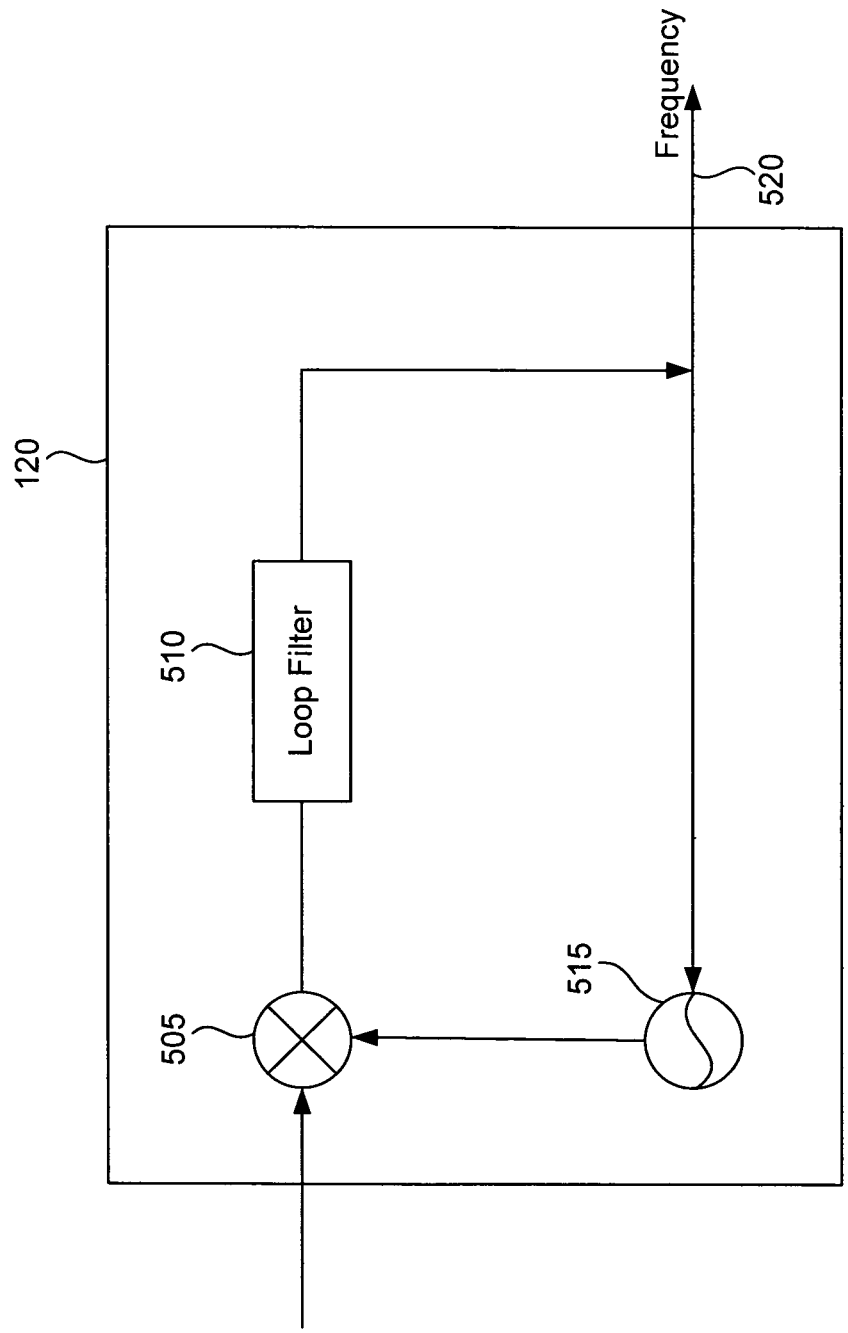
FIG. 5 is a diagram of a frequency determiner.

FIG. 5 provides another alternative embodiment of frequency determiner 120. FIG. 5 provides a phase locked loop design to lock to the frequency of the received digital sampled signal. In FIG. 5 frequency determiner 120 includes a mixer 505, a loop filter 510, and a local oscillator 515. The output of mixer 505 can be used as the phase detector for a phase locked loop. The phase locked loop can lock onto the incoming frequency and the input to local oscillator 515 serves as the frequency indicator signal estimate. This frequency estimate can be sampled by detector 130 to make a decision regarding the value of the FSK symbol carried by the received UHF signal.

Figure 6:
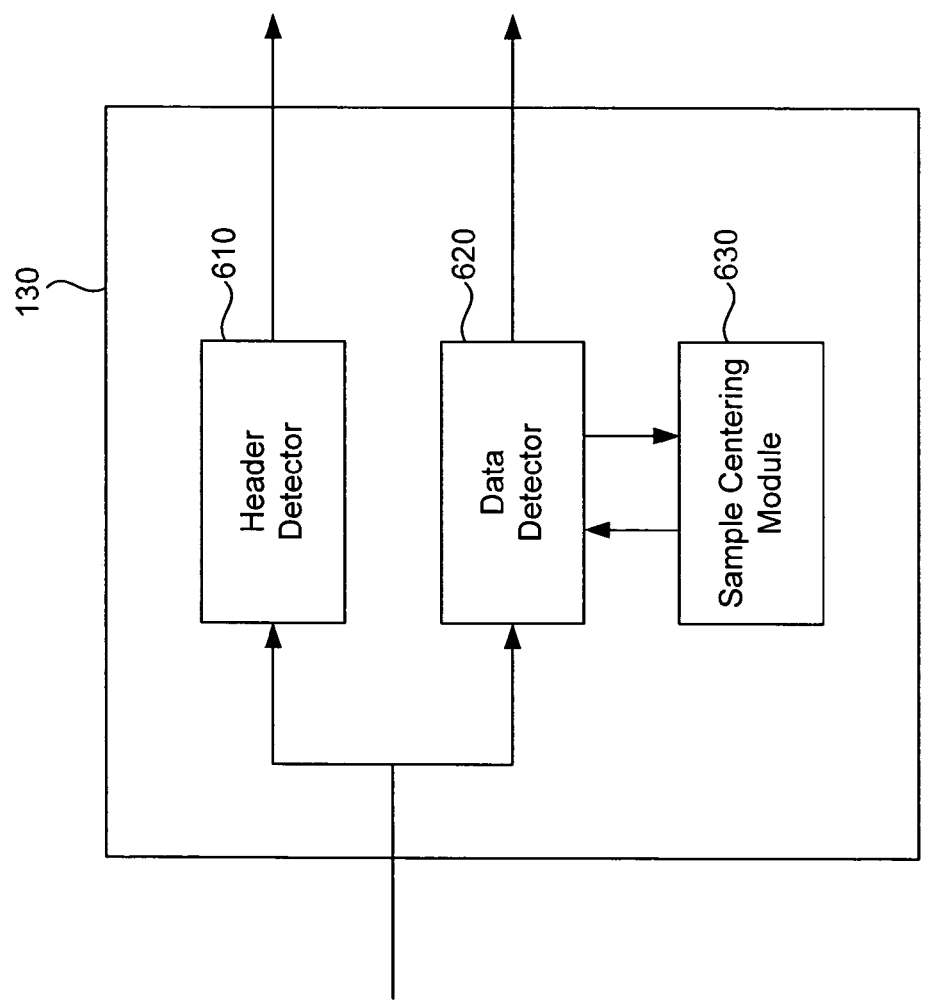
FIG. 6 is a high level diagram of a correlation detector.

FIG. 6 provides a high level block diagram of detector 130, when detector 130 is implemented as a correlation detector. In this case detector 130 includes a header detector 610, a data detector 620 and a sample centering module 630. Header detector 610 detects the type of message to be decoded. For example, a system may only transmit maintenance and data messages, each with a unique header. Header or preamble information will indicate the type of message to be decoded. Data detector 620 detects the data value of a received frequency indicator signal. Sample centering module 630 provides a sample time to data detector 620 for improving the precision of a sample rate used to detect the value of the received frequency indicator signal.

Figure 7:
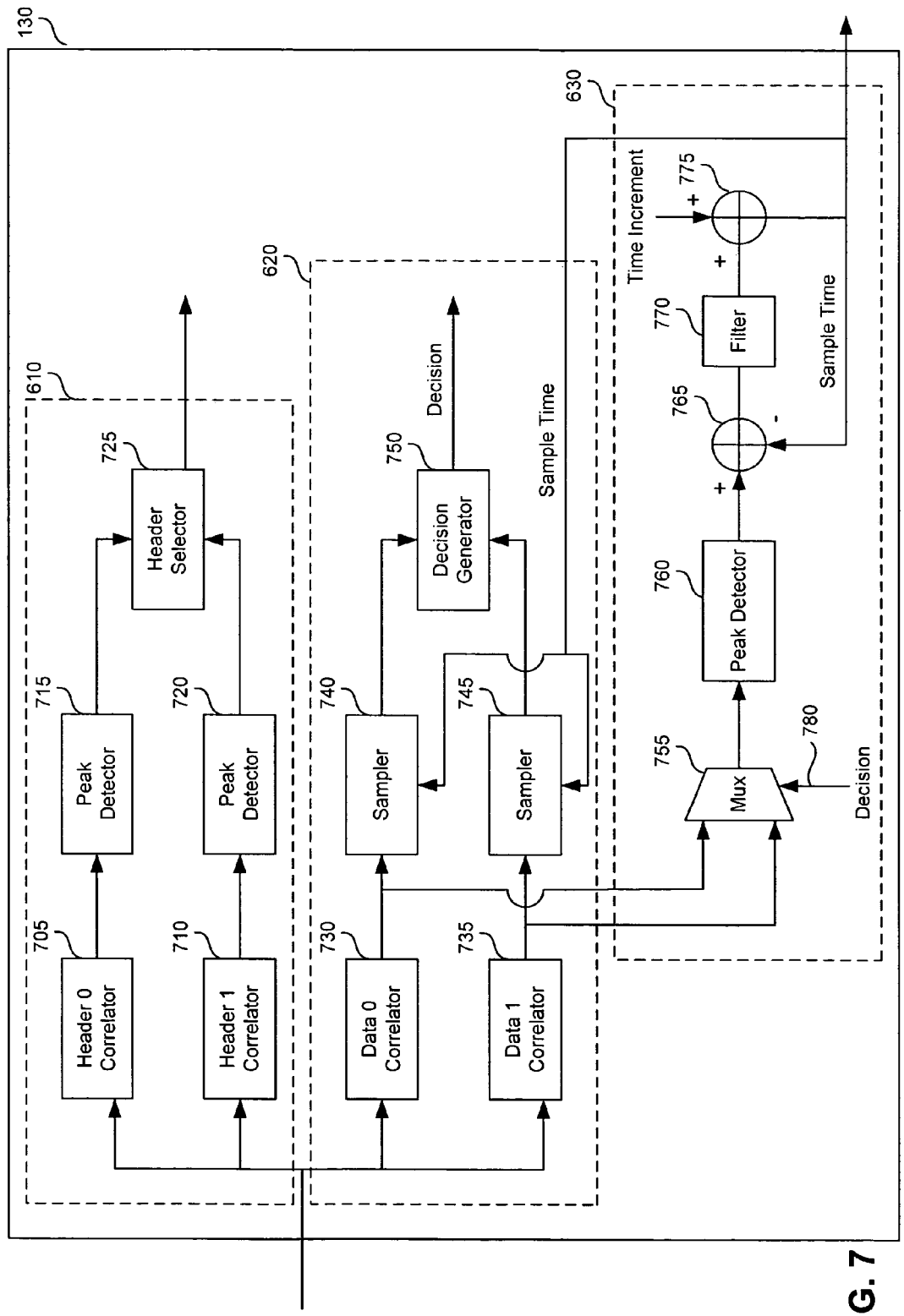
FIG. 7 is a diagram of a correlation detector.

FIG. 7 shows an example of detector 130 when implemented as a correlation detector. As indicated by FIG. 6, detector 130 includes three modules, header detector 610, data detector 620 and sample centering module 630. For ease of illustration, detector 130 is shown for binary FSK. Detector 130 can be used for m-ary FSK also with the addition of data correlators and associated circuits as would be known by persons skilled in the art based on the teachings herein.

Header detector 610 includes a header 0 correlator 705, a header 1 correlator 710, a peak detector 715, a peak detector 720 and a header selector 725. Data detector 620 includes a data 0 correlator 730, a data 1 correlator 735, a sampler 740, a sampler 745 and a decision generator 750. Sample centering module 630 includes a multiplexer 755, a peak detector 760, an adder 765, a filter 770 and an adder 775.

A frequency indicator signal is received from a frequency determiner, such as frequency determiner 120. The frequency indicator signal is passed to header 0 correlator 705 and header 1 correlator 710. Header 0 correlator 705 is coupled to peak detector 715. Header 0 correlator 705 compares the frequency indicator signal to a header pattern, for example, a pattern associated with a maintenance message. Peak detector 715 monitors the output of header 0 correlator to determine when a peak is achieved. Peak detector 715 passes information regarding a peak determination to header selector 725.

Header 1 correlator 710 functions in a similar manner. Header 1 correlator 710 compares the frequency indicator signal to a header pattern, for example, a pattern associated with a data message. Peak detector 720 monitors the output of header 1 correlator 710 to determine when a peak is achieved. Peak detector 720 passes information regarding a peak determination to header selector 725.

Header selector 725 compares the signals received from peak detector 715 and 720 to determine whether a header pattern has been received, the type of header pattern, and a reference time for the header message. In alternative embodiments, header detector 610 can support more than two types of header messages. In these cases, an additional header correlator and peak detector would be added for each of the header messages. As described above, the outputs of the peak detectors would be coupled to the header selector, which would then determine whether a header message had been received and the type of header message.

The data detector 620 component of detector 130 also receives as an input a frequency indicator signal. Data 0 correlator 730 receives the frequency indicator signal. Data 0 correlator 730 compares the frequency indicator signal to data value 0. Sampler 740 is coupled to the output of data 0 correlator 730 to sample the output from data 0 correlator 730. Sampler 740 receives a sample time indicator for when to sample the signal from sample centering module 630. The output of sampler 740 is coupled to decision generator 750.

Data 1 correlator 735 also receives the frequency indicator signal. Data 1 correlator 735 compares the frequency indicator signal to data value 1. Sampler 745 is coupled to the output of data 1 correlator 735 to sample the output from data 1 correlator 735. Sampler 745 receives a sample time indicator for when to sample the signal from sample centering module 630. The output of sampler 740 is then coupled to decision generator 750. Data correlators 730 and 735 can be configured for Manchester-encoded data, which provides coding gain due to a bi-level pattern.

Decision generator 750 compares the outputs of sampler 740 and sampler 745 to determine whether data value 1 or data value 0 is present. Decision generator 750 then outputs a decision of which data value is present. In other embodiments, more than two data correlators and corresponding samplers can be used when more than two data values are possible. For example, in an M-ary FSK system, M data correlators and corresponding samplers would be used.

Sample centering module 630 provides a sample time to data detector 620 for improving the precision of a sample rate used to control samplers 740 and 745. Sample centering module can be used to compensate for transmitted time-base drift or variation. Sample centering module 630 receives as inputs the outputs of data 0 correlator 730 and data 1 correlator 735. Specifically, multiplexer 755 receives the outputs of data correlators 730 and 735. Additionally, multiplexer 755 receives a control signal from decision generator 750 to control which data correlator output is passed through sample centering module 630. For example, if a decision is that data value 0 is present, multiplexer 755 will pass the signal output from data 0 correlator 730.

Multiplexer 755 is coupled to peak detector 760. Peak detector 760 detects a peak detection time and outputs the peak detection time to adder 765. The peak detection time is added to the sample time. Adder 765 passes the sum of the peak detection time and sample time through filter 770. The output of filter 770 is passed to adder 775. This output is then added to a time increment representing the expected separation of signals to create a sample time for the next received signal. This sample time is provided to samplers 740 and 745 and specifies the next time when a sample of the incoming frequency indicator signal should be taken.

As described above, the present invention includes parametric estimation circuits. Carrier offset can be calculated by averaging all the correlator input samples over a burst transmission. Alternatively, carrier offset can be estimated with an averaging 1-pole/1-zero filter, which provides an exponentially-weighted average of the more recent packet symbols. In either case, the carrier offset information can be used to compensate local oscillator 315, as shown in FIG. 3, or local oscillator 225 to center the incoming signal in the filters.

Additionally, frequency deviation can be estimated using minimum/maximum logic in the frequency indicator path after the data filter. This information can be used to narrow the baseband filters for greater noise rejection.

In an alternative embodiment detector 130 can be implemented as a slicer/comparator detector. When implemented as a slicer/comparator detector, detector 130 includes a slicer for generating a hard decision value from a received frequency indicator signal, a threshold comparator for generating a final data decision. The final data decision is generated by comparing the hard decision value with programmable thresholds. Detector 130 also includes a sample module for sampling the final data decision.

In another alternative embodiment of detector 130 when processing a binary FSK signal, a frequency indicator signal can be filtered by a 1-Pole/1-Zero programmable low pass "data" filter for noise reduction, and then fed to a comparator for making an output bit decision. The reference threshold is set by a second 1-pole/1-zero programmable low pass filter with a lower bandwidth than the data filter, which acts as an averaging filter, and thus provides an adaptive threshold for the data comparator. This alternative embodiment can be used when a carrier offset is unknown. Alternatively, the reference averaging filter can be loaded with a fixed value of a carrier offset estimate. In this case the reference value does not adapt. The comparator has a programmable amount of hysteresis for robustness against noise. The comparator output is also fed to a majority detect filter for further noise immunity. The output decisions can be fed to a programmable timer/decoder circuit, which monitors the output looking for one or more preamble/header patterns which indicate a valid message packet and storing the bit values when a valid packet is detected.

Figure 8:
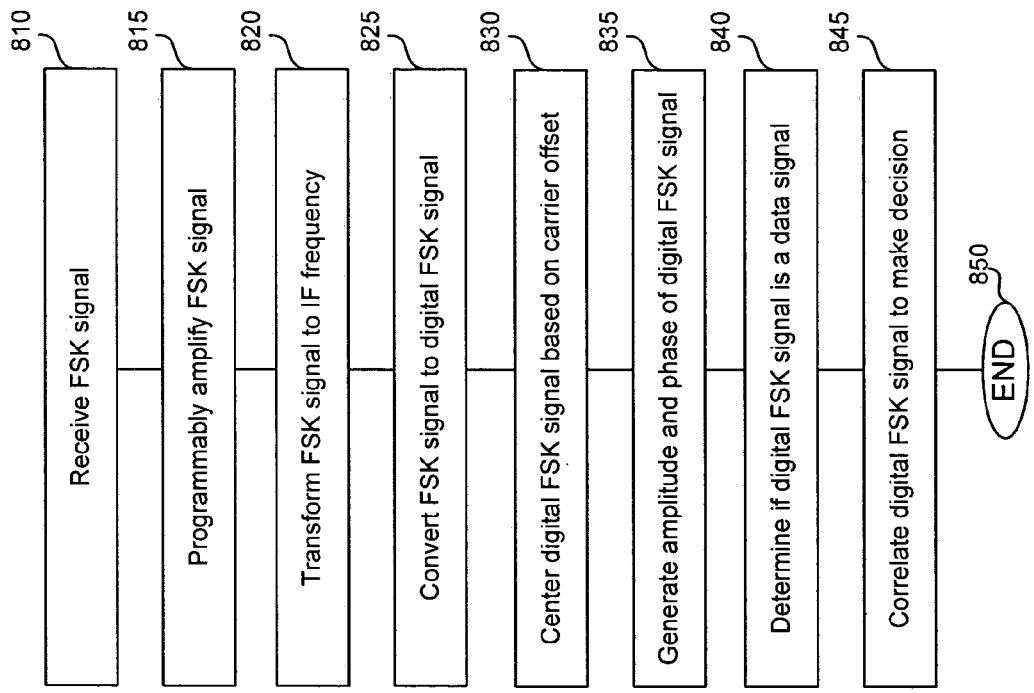
FIG. 8 is a flowchart of a method for determining a value of a received RF signal using FSK modulation.

FIG. 8 provides a flowchart of a method 800 for determining a value of a received RF signal using FSK modulation. Method 800 begins in step 810. In step 810 an RF signal using FSK modulation is received. In step 815, the received FSK RF signal is amplified. In step 820 the received FSK RF signal is transformed to a FSK IF or baseband signal. In step 825, the FSK downconverted signal is converted to a digital FSK signal. In step 830 the digital FSK signal is centered based on a carrier offset. In step 835 the amplitude and phase of the digital FSK signal are generated. In step 840 a determination is made as to whether the digital FSK signal is a data signal. In step 845, when the digital FSK signal is a data signal a correlation is done to make a decision as to the value of the FSK signal. In step 850, method 800 ends.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:
1. A frequency shift keying (FSK) receiver, comprising:
an RF converter configured to convert an RF signal to a digital sampled signal;
a frequency determiner configured to generate a frequency indicator signal that is proportional to a change in frequency of the digital sampled signal; and
a detector configured to determine a data value based on the frequency indicator signal;
wherein the frequency determiner comprises:
a first mixer configured to mix a local oscillator signal with a carrier offset signal to provide an adjusted local oscillator signal that has been compensated for a carrier offset in the digital sampled signal, wherein the carrier offset signal is calculated by averaging a plurality of samples of the frequency indicator signal;
a second mixer configured to mix the digital sampled signal with the adjusted local oscillator signal to provide I and Q signal components from the digital sampled signal;
a rectangular to polar conversion module configured to convert the I and Q signal components into an amplitude and phase of the digital sampled signal; and
a derivative module configured to receive the phase of the digital sampled signal and produce the frequency indicator signal based on a derivative of the phase of the digital sampled signal.
2. The FSK receiver of claim 1, wherein the carrier offset signal is provided by the detector.
3. The FSK receiver of claim 1, further comprising:
a first and second low pass filter configured to respectively filter the I and Q signal components.
4. The FSK receiver of claim 1, further comprising:
a first and second bandpass filter configured to respectively filter the I and Q signal components.
5. The FSK receiver of claim 1, further comprising:
an anti-aliasing filter configured to remove images generated by an analog to digital conversion coupled to the I and Q signal components.
6. The FSK receiver of claim 1, further comprising:
a down-sampler configured to down sample the I and Q signal components.
7. A frequency shift keying (FSK) receiver, comprising:
an RF converter configured to convert an FSK modulated RF signal to a digital sampled signal;
a frequency determiner configured to generate a frequency indicator signal that is proportional to a change in frequency of the digital sampled signal; and a correlation detector comprising:
a header detector configured to detect a header pattern, associated with the frequency indicator signal, that indicates a type of message to be decoded, wherein the header detector includes a header correlator and peak detector for each type of message to be detected;
a data detector configured to detect a data value associated with the frequency indicator signal; and
a sample centering module configured to provide a sample time to the data detector to improve the precision of a sample rate used to sample the data value associated with the frequency indicator signal.

8. The detector of claim 7, wherein the header detector comprises:
a first header correlator configured to correlate the frequency indicator signal with a first known header;
a first peak detector configured to detect a peak output from the first header correlator;
a second header correlator configured to correlate the frequency indicator signal with a second known header;
a second peak detector configured to detect a peak output from the second header correlator; and
a header selector configured to determine the header type associated with the frequency indicator signal coupled to the outputs of the first and second peak detectors.

9. The detector of claim 8, wherein the header selector is configured to determine a reference time for when the header is received.

10. The detector of claim 8, further comprising:
a carrier offset detector coupled to the header selector and configured to generate a carrier offset frequency associated with a received frequency.

11. The detector of claim 7, wherein the data detector comprises:
a first data correlator configured to correlate the frequency indicator signal with a first known data value;
a first sampler configured to sample the output of the first data correlator, wherein the sampling time is provided by the sample centering module;
a second data correlator configured to correlate the frequency indicator signal with a second known data value;
a second sampler configured to sample the output of the first data correlator, wherein the sampling time is provided by the sample centering module; and
a decision generator configured to determine the data value associated with the frequency indicator signal.

12. The detector of claim 7, wherein the sample centering module comprises:
a multiplexer coupled to the data detector and configured to transmit the frequency indicator signal;
a peak detector coupled to the multiplexer and configured to determine a peak detection time of the frequency indicator signal;
a first adder coupled to the peak detector configured to subtract a sample time from the peak detection time;
a loop filter coupled to the adder; and
a second adder configured to receive a time increment equal to an expected time increment between data values associated with the frequency indicator signal and add the expected time increment to the peak detection time to produce a sample time.

13. The detector of claim 7, wherein the type of message to be decoded is at least one of a maintenance message and a data message.

* * * * *